United States Patent [19]
Mehendale

[11] Patent Number: 5,977,792
[45] Date of Patent: Nov. 2, 1999

[54] CONFIGURABLE LOGIC CIRCUIT AND METHOD

[75] Inventor: Mehesh M. Mehendale, Bangalore, India

[73] Assignee: Texas Instruments Incorporated, Dallas, Tex.

[21] Appl. No.: 08/990,350

[22] Filed: Dec. 15, 1997

[51] Int. Cl.$^6$ ............................................. H03K 19/177
[52] U.S. Cl. ................................. 326/40; 326/46; 326/38
[58] Field of Search ................................. 326/37–41, 46, 326/47, 93

[56] References Cited

U.S. PATENT DOCUMENTS

| | | | |
|---|---|---|---|
| 5,491,431 | 2/1996 | Nasserbakht | 326/38 |
| 5,502,402 | 3/1996 | Mehendale | 326/40 |
| 5,508,637 | 4/1996 | Mehendale | 326/38 |
| 5,751,162 | 5/1998 | Mehendale et al. | 326/39 |
| 5,781,033 | 7/1998 | Galbraith et al. | 326/39 |

Primary Examiner—Michael Tokar
Assistant Examiner—Don Phu Le
Attorney, Agent, or Firm—Robert D. Marshall, Jr.; Gerald E. Laws; Richard L. Donaldson

[57] ABSTRACT

Configurable logic circuit (10,110) and method may comprise a control circuit (12,112) and a logic circuit (14,114). The control circuit (12,112) may generate an intermediate clock function (36,136) in response to selection of one of a first (30,130) and a second (32,132) clock input based on a clock control input (34,134), generate a first control function (46,146) in response to selection of one of a first (40,140) and a second (42,142) control input based on the intermediate clock function (36,136) and generate a second control function (56,156) in response to selection of one of the second (42,142) and a third (52,152) control input based on the intermediate clock function (36,136). The logic circuit (14,114) may be coupled to the control circuit (12,112) and configured into one of a plurality of logic modes in response to a combination of the first (46,146) and second control functions (56,156).

20 Claims, 1 Drawing Sheet

CONFIGURABLE LOGIC CIRCUIT AND METHOD

TECHNICAL FIELD OF THE INVENTION

This invention relates generally to the field of integrated circuits, and more particularly to a configurable logic circuit and method.

BACKGROUND OF THE INVENTION

Field programmable gate arrays (FPGA) are integrated circuits that may be configured "in the field" by a user to form complex logic circuits. FPGAs have been widely used as application-specific integrated circuits (ASICs) due to their short design cycle and low cost. FPGAs are also used to build prototypes of high density, high speed, custom chips and ASIC devices in which a number of FPGAs may be used to emulate a hardware configuration.

A typical FPGA architecture consists of a two-dimensional array of universal logic modules that can be selectively connected using a programmable interconnect structure. The universal logic modules may include a number of functional devices such as diodes, transistors, logic gates, multiplexers and the like. The universal logic modules are interconnected by selectively programming the programmable interconnects to establish connection between the output of one logic module and the input of other logic modules. The programmable interconnects may be fuses, antifuses, or the like.

The complexity of the configurable logic modules and programmable interconnect system generally requires a relatively large amount of space on an integrated circuit. Such complexity may also cause delays and otherwise degrade performance of the FPGA.

SUMMARY OF THE INVENTION

Accordingly, a need has arisen in the art for an improved configurable logic circuit for field programmable gate arrays (FPGA). The present invention provides a configurable logic circuit and method that substantially reduces or eliminates the problems associated with prior systems and methods.

In accordance with the present invention, a configurable logic circuit may comprise a control circuit and a logic circuit. The control circuit may generate an intermediate clock function in response to selection of one of a first and a second clock input based on a clock control input, generate a first control function in response to selection of one of a first and a second control input based on the intermediate clock function and generate a second control function in response to selection of one of the second and a third control input based on the intermediate clock function. The logic circuit may be coupled to the control circuit and configured into one of a plurality of logic modes in response to a combination of the first and second control functions.

More specifically, in accordance with one embodiment of the present invention, the logic circuit may be configured into one of a rising edge triggered flip-flop mode, a falling edge triggered flip-flop mode, an active high latch mode, an active low latch mode and a transparent mode in response to the combination of the first and second control functions.

The control circuit may comprise first, second and third control multiplexers. In this embodiment, the first control multiplexer may generate the intermediate clock function in response to selection of one of the first and the second clock input based on the clock control input. The second control multiplexer may generate the first control function in response to the selection of one of the first and the second control input based on the intermediate clock function. The third control multiplexer may generate the second control function in response to selection of one of the second and the third control input based on the intermediate clock function.

The logic circuit may comprise first and second logic multiplexers. In this embodiment, the first logic multiplexer may generate an intermediate data function in response to selection of one of a data input and a feedback intermediate data function based on the first control function. The second logic multiplexer may generate a data function in response to selection of one of the intermediate data function and a feedback data function based on the second control function.

In accordance with another aspect of the present invention, the logic circuit may comprise a bypass switch connected between an input and an output line. The bypass switch may close in response to the combination of the first and second control functions. In a particular embodiment, a NOR gate may be coupled to the bypass switch to close the switch in response to the combination of the first and second control functions.

Technical advantages of the present invention include providing an improved field programmable gate array (FPGA). In particular, the FPGA may comprise smaller, faster and more cost effective configurable logic circuits. Accordingly, the size, speed and cost of the FPGA is improved.

Another technical advantage of the present invention includes providing an improved configurable logic circuit. In particular, the configurable logic circuit may provide needed or desired functionality with a reduced number of elements, such as transistors and antifuses. Accordingly, the configurable logic circuit is small, fast and cost efficient.

Additional technical advantages of the present invention include providing a bypass to speed up the transparent mode. In particular, a bypass switch may be connected between the input and output lines. The bypass switch may close in response to the combination of the first and second control functions. Accordingly, operation of the configurable logic circuit may be speeded up in the transparent mode.

Other technical advantages of the present invention will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

Figure 1:
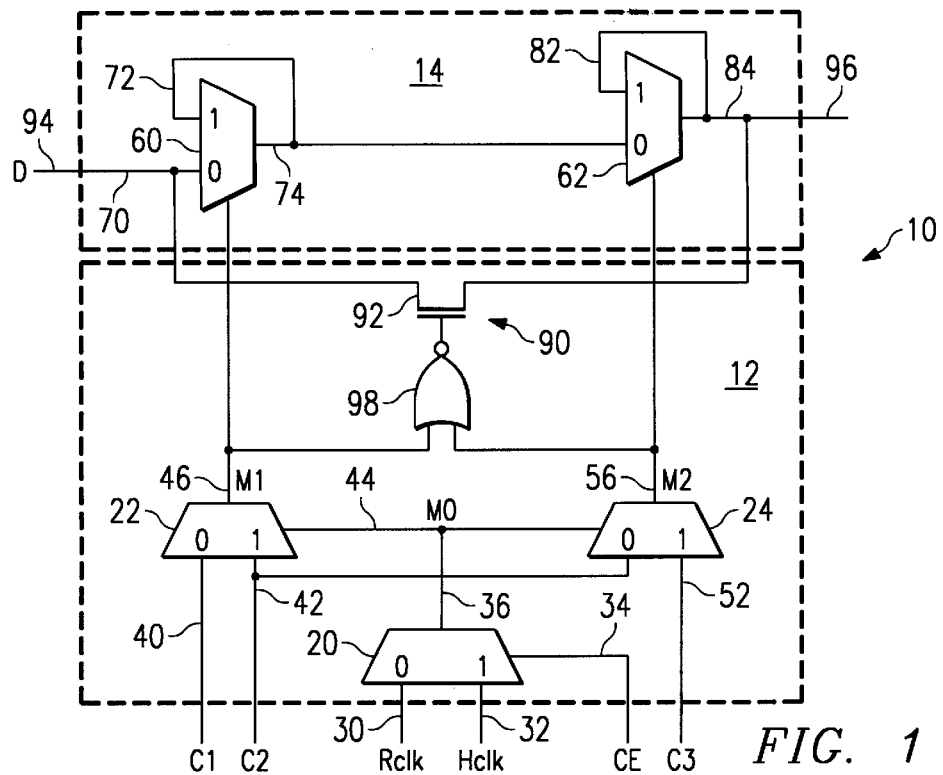
FIG. 1 is a block diagram illustrating a configurable logic circuit in accordance with one embodiment of the present invention.
Figure 2:
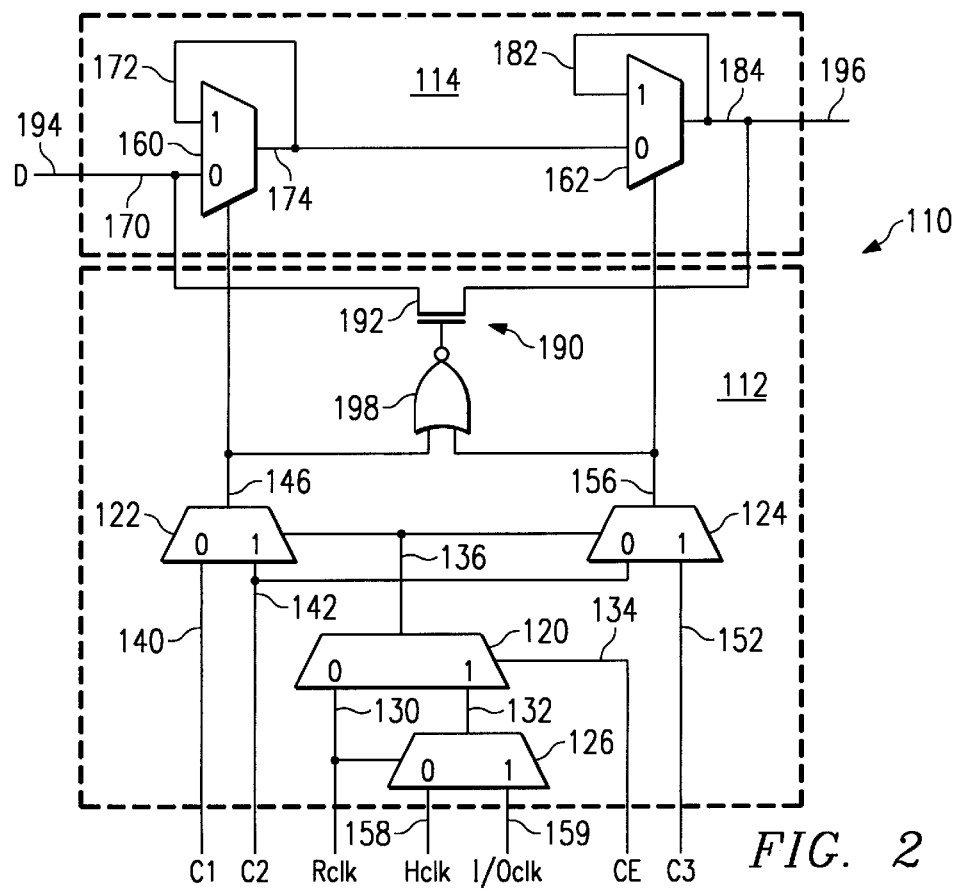
FIG. 2 is a block diagram illustrating a configurable logic circuit in accordance with another embodiment of the present invention.

The preferred embodiments of the present invention and its advantages are best understood by referring now in more detail to FIGS. 1–2 of the drawings, in which like numerals refer to like parts. FIGS. 1–2 illustrate several configurable logic circuits in accordance with the present invention. As described in more detail below, the configurable logic circuits may each comprise a control circuit and a logic circuit. The control circuit may generate an intermediate clock function in response to selection of one of a first and a second clock signal based on a clock control input, a first control function in response to selection of one of a first and a second control input based on the intermediate clock function and a second control function in response to selection of one of the second and a third control input based on the intermediate clock function. The logic circuit may be coupled to the control circuit and configured into one of a plurality of logic modes in response to a combination of the first and second control functions. Accordingly, the configurable logic circuit may provide needed functionality with a reduced number of elements. As a result, the size, speed and cost of the configurable logic circuit is improved.

FIG. 1 is a block diagram illustrating a configurable logic circuit 10 in accordance with one embodiment of the present invention. The configurable logic circuit 10 may form part of a field programmable gate array (FPGA), other application-specific integrated circuit (ASIC) and the like. It will be understood that the configurable logic circuit 10 may be used in other types of integrated circuits within the scope of the present invention.

The configurable logic circuit 10 may comprise a control circuit 12 and a logic circuit 14. As described in more detail below, the control circuit 12 may generate a set of control functions that configure the logic circuit 14. It will be understood that the control circuit 12 may generate other or different functions within the scope of the present invention.

For the embodiment of FIG. 1, the control circuit 12 may comprise a first control multiplexer 20, a second control multiplexer 22 and a third control multiplexer 24. In this embodiment, each of the control multiplexers 20, 22 and 24 may be a conventional 2:1 multiplexer having a set of input signals, a select signal and an output signal. It will be understood that the control circuit 12 may comprise other or different control multiplexers and/or other integrated circuit elements within the scope of the present invention.

The first control multiplexer 20 may receive a routed clock (Rclk) signal 30 as a "0" input, a hardwired clock (Hclk) signal 32 as a "1" input and a clock control (CE) signal 34 as a select signal. In this embodiment, the first control multiplexer 20 may generate an intermediate clock function 36 as the output signal in response to selection of one of the routed clock input 30 and the hardwired clock input 32 based on the clock control signal 34. It will be understood that the selection of one of the routed clock input 30 and the hardwired clock input 32 means the selection of one of those inputs 30 and 32 from a set of inputs including at least the routed clock input 30 and the hardwired clock input 32. It will be further understood that the control circuit 12 may otherwise generate an intermediate clock function within the scope of the present invention.

In a particular embodiment, the first control multiplexer 20 may select the routed clock input 30 as the intermediate clock function 36 when the clock control signal 34 is zero. In this embodiment, the first control multiplexer 20 may select the hardwired clock input 32 as the intermediate clock function 36 when the routed clock signal is zero. In this case, the clock control signal 34 is one and acts as the enable signal. Thus, the clock control signal 34 may be "0" when the routed clock signal is to be used and "1" when the routed clock signal is not to be used. It will be understood that the routed and hardwired clock inputs may be otherwise selected within the scope of the present invention. It will be further understood that the configurable logic circuit 10 may be used to support other architectures having a dedicated clock network and a programmed clock network.

The second control multiplexer 22 may receive a first control (C1) signal 40 as a "0" input, a second control (C2) signal 42 as a "1" input and the intermediate clock function 36 generated by the first control multiplexer 20 as a select signal. In this embodiment, the second control multiplexer 22 may generate a first control function 46 as the output signal in response to selection of one of the first control input 40 and the second control input 42 based on the intermediate clock function 36. It will be understood that the selection of one of the first control input 40 and the second control input 42 means the selection of one of those inputs 40 and 42 from a set of inputs including at least the first control input 40 and the second control input 42. It will be further understood that the control circuit 12 may otherwise generate a first control function within the scope of the present invention.

The third control multiplexer 24 may receive the second control (C2) input 42 as a "0" input, a third control (C3) input 52 as a "1" input and the intermediate clock function 36 generated by the first control multiplexer 20 as a select signal. In this embodiment, the third control multiplexer 24 may generate a second control function 56 as the output signal in response to selection of one of the second control input 42 and the third control input 52 based on the intermediate clock function 36. It will be understood that the selection of one of the second control input 42 and the third control input 52 means the selection of one of those inputs 42 and 52 from a set of inputs including at least the second control input 42 and the third control input 52. It will be further understood that the control circuit 12 may otherwise generate a second control function within the scope of the present invention.

In accordance with the present invention, the first and second control functions 46 and 56 may configure the logic circuit 14 into a plurality of logic modes. Accordingly, the configurable logic circuit 10 may provide needed and/or desired functionality with a reduced number of elements, such as transistors and antifuses. As a result, the configurable logic circuit is small, fast and cost efficient.

The logic circuit 14 may comprise one or more logic elements. For the embodiment of FIG. 1, the logic circuit 14 may comprise sequential logic elements of a first logic multiplexer 60 and a second logic multiplexer 62. In this embodiment, each of the logic multiplexers 60 and 62 may be a conventional 2:1 multiplexer having a set of input signals, a select signal and an output signal. It will be understood that the logic circuit 14 may comprise other or different logic multiplexers and/or other integrated circuit elements within the scope of the present invention.

The first logic multiplexer 60 may receive a data (D) signal 70 as a "0" input, a feedback intermediate data function 72 as a "1" input and the first control function 46 generated by the control circuit 12 as a select signal. In this embodiment, the first logic multiplexer 60 may generate an intermediate data function 74 as the output signal in response to selection of one of the data input 70 and the feedback intermediate data function 72 based on the first control function 46. It will be understood that the selection of one of the data input 70 and the feedback intermediate data function 72 means the selection of one of those inputs 70 and 72 from a set of inputs including at least the data input 70 and the feedback intermediate data function 72. It will be further understood that the logic circuit 14 may otherwise generate an intermediate data function within the scope of the present invention.

The second logic multiplexer 62 may receive the intermediate data function 74 generated by the first logic multiplexer 60 as a "0" input, a feedback data function 82 as a "1" input and the second control function 56 generated by the control circuit 12 as a select signal. In this embodiment, the second logic multiplexer 62 may generate a data function 84 as the output signal in response to selection of one of the intermediate data function 74 and the feedback data function 82 based on the second control function 56. It will be understood that the selection of one of the intermediate data function 74 and the feedback data function 82 means the selection of one of those inputs 74 and 82 from a set of inputs including at least the intermediate data function 74 and the feedback data function 82. It will be further understood that the logic circuit 14 may otherwise generate a data function within the scope of the present invention.

As described in more detail below, the logic circuit 14 may be operable to be configured into one of a rising edge triggered flip-flop mode, a falling edge triggered flip-flop mode, an active high latch mode, an active low latch mode, and a transparent mode in response to the combination of the first and second control functions 46 and 56 of the control circuit 12. In one embodiment, the logic circuit 14 may be configured into the rising edge triggered flip-flop mode in response to a first combination of the first and second control functions 46 and 56, the falling edge triggered flip-flop mode in response to a second combination of the first and second control functions 46 and 56, the active high latch mode in response to a third combination of the first and second control functions 46 and 56, the active low latch mode in response to a fourth combination of the first and second control functions 46 and 56 and the transparent mode in response to a fifth combination of the first and second control functions 46 and 56. It will be understood that the logic circuit 14 may be otherwise configured into other or different modes in response to other or different functions or inputs within the scope of the present invention.

In a particular embodiment, the logic circuit 14 may be configured into the rising edge flip-flop mode by setting the first control input 40 to zero, the second control input 42 to one and the third control input 52 to zero. As a result, the first control function 46 of the second control multiplexer 22 may be the intermediate clock function 36 and the second control function 56 of the third control multiplexer 24 may be the complement of the intermediate clock function 36. Accordingly, the first and second multiplexers 60 and 62 of the logic circuit 14 will be configured into the rising edge flip-flop mode. For the rising edge flip-flop mode, the clock can be selected from the routed clock signal 30 and the hardwired clock input 32 depending on the clock control signal 34. It will be understood that the logic circuit 14 may be otherwise configured into the rising edge flip-flop mode within the scope of the present invention.

The logic circuit 14 may be configured into the falling edge flip-flop mode by setting the first control input 40 to one, the second control input 42 to zero and the third control input 52 to one. As a result, the first control function 46 of the second control multiplexer 22 may be the complement of the intermediate clock function 36 and the second control function 56 of the third control multiplexer 24 may be the intermediate clock function 36. Accordingly, the first and second multiplexers 60 and 62 of the logic circuit 14 will be configured into the falling edge flip-flop mode. For the falling edge flip-flop mode, the clock can be selected from the routed clock signal 30 and the hardwired clock input 32 depending on the clock control signal 34. It will be understood that the logic circuit 14 may be otherwise configured into the falling edge flip-flop mode within the scope of the present invention.

The logic circuit 14 may be configured into the active low latch (high transparent) mode by setting the first control input 40 to one, the second control input 42 to zero and the third control input 52 to zero. As a result, the first control function 46 of the second control multiplexer 22 may be the complement of the intermediate clock function 36 and the second control function 56 of the third control multiplexer 24 may be zero. Accordingly, the first and second multiplexers 60 and 62 of the logic circuit 14 will be configured into the active low latch mode. For the active low latch mode, the clock can be selected from the routed clock signal 30 and the hardwired clock input 32 depending on the clock control signal 34. It will be understood that the logic circuit 14 may be otherwise configured into the active low latch mode within the scope of the present invention.

The logic circuit 14 may be configured into the active high latch (low transparent) mode by setting the first control input 40 to zero, the second control input 42 to zero and the third control input 52 to one. As a result, the first control function 46 of the second control multiplexer 22 may be zero and the second control function 56 of the third control multiplexer 24 may be the intermediate clock function 36. Accordingly, the first and second multiplexers 60 and 62 of the logic circuit 14 will be configured into the active high latch mode. For the active high latch mode, the clock can be selected from the routed clock signal 30 and the hardwired clock input 32 depending on the clock control signal 34. It will be understood that the logic circuit 14 may be otherwise configured into the active high latch mode within the scope of the present invention.

The logic circuit 14 may be configured into the transparent mode by setting the first control input 40 to zero, the second control input 42 to zero and the third control input 52 to zero. As a result, the first control function 46 of the second control multiplexer 22 may be zero and the second control function 56 of the third control multiplexer 24 may also be zero. Accordingly, the first and second multiplexers 60 and 62 of the logic circuit 14 will be configured into the transparent mode. It will be understood that the logic circuit 14 may be otherwise configured into the transparent mode within the scope of the present invention.

In accordance with another aspect of the present invention, the configurable logic circuit 10 may comprise a bypass 90. In one embodiment, the bypass 90 may be included in the control circuit 12. It will be understood that the bypass 90 may be otherwise disposed in the configurable logic circuit 10 within the scope of the present invention. For example, the bypass may be included in the logic circuit 14.

The bypass 90 may comprise a bypass switch 92 connected between an input line 94 and an output line 96 of the logic circuit 14. The bypass switch 92 may close in response to the transparent mode combination of the first and second control functions 46 and 56 to allow the data input 70 received at the input line 94 to be transmitted to the output line 96 as the data function 84. Accordingly, operation of the configurable logic circuit 10 may be speeded up in the transparent mode.

In one embodiment, the bypass switch 92 may comprise a conventional NMOS transistor. In this embodiment, a NOR gate 98 may be coupled to the transistor to close the transistor in response to the transparent mode combination of the first and second control functions 46 and 56. Thus, for the particular embodiment described above, the NOR gate 98 will close the transistor to allow the data input 70 received at the input line 94 to be transmitted to the output line 96 as the data function 84 in response to the first and second control functions 46 and 56 being zero. It will be understood that the bypass 90 may be otherwise configured within the scope of the present invention.

FIG. 2 is a block diagram illustrating a configurable logic circuit 110 in accordance with another embodiment of the present invention. The configurable logic circuit 110 may form an input/output module of a field programmable gate array (FPGA), other application-specific integrated circuit (ASIC) and the like. It will be understood that the configurable logic circuit 110 may be used in other types of integrated circuits within the scope of the present invention.

The configurable logic circuit 110 may comprise a control circuit 112 and a logic circuit 114. As described in more detail below, the control circuit 112 may generate a set of control functions that configures the logic circuit 114. It will be understood that the control circuit 112 may generate other or different functions within the scope of the present invention.

For the embodiment of FIG. 2, the control circuit 112 may comprise a first control multiplexer 120, a second control multiplexer 122, a third control multiplexer 124 and a fourth control multiplexer 126. In this embodiment, each of the control multiplexers 120, 122, 124 and 126 may be a conventional 2:1 multiplexer having a set of input signals, a select signal and an output signal. It will be understood that the control circuit 112 may comprise other or different control multiplexers and/or other integrated circuit elements within the scope of the present invention.

The first control multiplexer 120 may receive a routed clock (Rclk) signal 130 as a "0" input, a first intermediate clock function 132 as a "1" input and a clock control (CE) signal 134 as a select signal. In this embodiment, the first control multiplexer 120 may generate a second intermediate clock function 136 as the output signal in response to selection of one of the routed clock input 130 and the first intermediate clock function 132 based on the clock control signal 134. It will be understood that the selection of one of the routed clock input 130 and the first intermediate clock function 132 means the selection of one of those inputs 130 and 132 from a set of inputs including at least the routed clock input 130 and the first intermediate clock function 132. It will be further understood that the control circuit 112 may otherwise generate a second intermediate clock function within the scope of the present invention.

The second control multiplexer 122 may receive a first control (C1) signal 140 as a "0" input, a second control (C2) signal 142 as a "1" input and the second intermediate clock function 136 generated by the first control multiplexer 120 as a select signal. In this embodiment, the second control multiplexer 122 may generate a first control function 146 as the output signal in response to selection of one of the first control input 140 and the second control input 142 based on the second intermediate clock function 136. It will be understood that the selection of one of the first control input 140 and the second control input 142 means the selection of one of those inputs 140 and 142 from a set of inputs including at least the first control input 140 and the second control input 142. It will be further understood that the control circuit 112 may otherwise generate a first control function within the scope of the present invention.

The third control multiplexer 124 may receive the second control (C2) input 142 as a "0" input, a third control (C3) input 152 as a "1" input and the second intermediate clock function 136 generated by the first control multiplexer 120 as a select signal. In this embodiment, the third control multiplexer 124 may generate a second control function 156 as the output signal in response to selection of one of the second control input 142 and the third control input 152 based on the second intermediate clock function 136. It will be understood that the selection of one of the second control input 142 and the third control input 152 means the selection of one of those inputs 142 and 152 from a set of inputs including at least the second control input 142 and the third control input 152. It will be further understood that the control circuit 112 may otherwise generate a second control function within the scope of the present invention.

The fourth control multiplexer 126 may receive a hardwired clock (Hclk) signal 158 as a "0" input, an input/output clock (I/Oclk) signal 159 as a "1" input and the routed clock signal 130 as a select signal. In this embodiment, the fourth control multiplexer 126 may generate the first intermediate clock function 132 as the output signal in response to selection of one of the hardwired clock input 158 and the input/output clock input 159 based on the routed clock signal 130. It will be understood that the selection of one of the hardwired clock input 158 and the input/output clock input 159 means the selection of one of those inputs 158 and 159 from a set of inputs including at least the hardwired clock input 158 and the input/output clock input 159. It will be further understood that the control circuit 12 may otherwise generate the first intermediate clock function within the scope of the present invention.

In a particular embodiment, the first control multiplexer 120 may select the routed clock input 130 as the second intermediate clock function 136 when the clock control signal 134 is zero. In this embodiment, the first control multiplexer 120 may select the first intermediate clock function 132 as the second intermediate clock function 136 when the clock control signal 134 is one and acts as the enable signal. Thus, the clock control signal 134 may be "0" when the routed clock signal is to be used and "1" when either the hardwired clock inputs 158 or the input/output clock input 159 is to be used. In the latter case, the fourth control multiplexer 126 may select the hardwired clock input 158 as the first intermediate clock function 132 when the routed clock input 130 is zero and the input/output clock input 159 as the first intermediate clock function 132 when the routed clock input 130 is one. Thus, the routed clock input 130 may be "0" when the hardwired clock input 158 is to be used and "1" when the input/output clock input 159 is to be used. It will be understood that the routed, hardwired and input/output clock inputs may be otherwise selected within the scope of the present invention. It will be further understood that the configurable logic circuit 110 may be used to support other architectures having a plurality of dedicated clock network and a programmed clock network.

In accordance with the present invention, the first and second control functions 146 and 156 may configure the logic circuit 114 into a plurality of logic modes. Accordingly, the configurable logic circuit 110 may provide needed and/or desired input/output functionality with a reduced number of elements, such as transistors and antifuses. As a result, the configurable logic circuit 110 is small, fast and cost efficient.

As previously described in connection with the logic circuit 14, the logic circuit 114 may comprise one or more logic elements. For the embodiment of FIG. 2, the logic circuit 114 may comprise sequential logic elements of a first logic multiplexer 160 and a second logic multiplexer 162. In this embodiment, each of the logic multiplexers 160 and 162 may be a conventional 2:1 multiplexer having a set of input signals, a select signal and an output signal. It will be understood that the logic circuit 114 may comprise other or different logic multiplexers and/or other integrated circuit elements within the scope of the present invention.

The first logic multiplexer 160 may receive a data (D) signal 170 as a "0" input, a feedback intermediate data function 172 as a "1" input and the first control function 146 generated by the control circuit 112 as a select signal. In this embodiment, the first logic multiplexer 160 may generate an intermediate data function 174 as the output signal in response to selection of one of the data input 170 and the feedback intermediate data function 172 based on the first control function 146. It will be understood that the selection of one of the data input 170 and the feedback intermediate data function 172 means the selection of one of those inputs 170 and 172 from a set of inputs including at least the data input 170 and the feedback intermediate data function 172. It will be further understood that the logic circuit 114 may otherwise generate an intermediate data function within the scope of the present invention.

The second logic multiplexer 162 may receive the intermediate data function 174 generated by the first logic multiplexer 160 as a "0" input, a feedback data function 182 as a "1" input and the second control function 156 generated by the control circuit 112 as a select signal. In this embodiment, the second logic multiplexer 162 may generate a data function 184 as the output signal in response to selection of one of the intermediate data function 174 and the feedback data function 182 based on the second control function 156. It will be understood that the selection of one of the intermediate data function 174 and the feedback data function 182 means the selection of one of those inputs 174 and 182 from a set of inputs including at least the intermediate data function 174 and the feedback data function 182. It will be further understood that the logic circuit 114 may otherwise generate a data function within the scope of the present invention.

As described in more detail below, the logic circuit 114 may be operable to be configured into one of a rising edge triggered flip-flop mode, a falling edge triggered flip-flop mode, an active high latch mode, an active low latch mode, and a transparent mode in response to the combination of the first and second control functions 146 and 156 of the control circuit 112. In one embodiment, the logic circuit 114 may be configured into the rising edge triggered flip-flop mode in response to a first combination of the first and second control functions 146 and 156, the falling edge triggered flip-flop mode in response to a second combination of the first and second control functions 146 and 156, the active high latch mode in response to a third combination of the first and second control functions 146 and 156, the active low latch mode in response to a fourth combination of the first and second control functions 146 and 156 and the transparent mode in response to a fifth combination of the first and second control functions 146 and 156. It will be understood that the logic circuit 114 may be otherwise configured into other or different modes in response to other or different functions or inputs within the scope of the present invention.

In a particular embodiment, the logic circuit 114 may be configured into the rising edge flip-flop mode by setting the first control input 140 to zero, the second control input 142 to one and the third control input 152 to zero. As a result, the first control function 146 of the second control multiplexer 122 may be the second intermediate clock function 136 and the second control function 156 of the third control multiplexer 124 may be the complement of the second intermediate clock function 136. Accordingly, the first and second multiplexers 160 and 162 of the logic circuit 114 will be configured into the rising edge flip-flop mode. For the rising edge flip-flop mode, the clock can be selected from the routed clock input 130, the hardwired clock input 158, and the input/output clock input 159 depending on the clock control signal 134 and/or the routed clock input 130. It will be understood that the logic circuit 114 may be otherwise configured into the rising edge flip-flop mode within the scope of the present invention.

The logic circuit 114 may be configured into the falling edge flip-flop mode by setting the first control input 140 to one, the second control input 142 to zero and the third control input 152 to one. As a result, the first control function 146 of the second control multiplexer 122 may be the complement of the second intermediate clock function 136 and the second control function 156 of the third control multiplexer 124 may be the second intermediate clock function 136. Accordingly, the first and second multiplexers 160 and 162 of the logic circuit 114 will be configured into the falling edge flip-flop mode. For the falling edge flip-flop mode, the clock can be selected from the routed clock input 130, the hardwired clock input 158, and the input/output clock input 159 depending on the clock control signal 134 and/or the routed clock input 130. It will be understood that the logic circuit 114 may be otherwise configured into the falling edge flip-flop mode within the scope of the present invention.

The logic circuit 114 may be configured into the active low latch (high transparent) mode by setting the first control input 140 to one, the second control input 142 to zero and the third control input 152 to zero. As a result, the first control function 146 of the second control multiplexer 122 may be the complement of the second intermediate clock function 136 and the second control function 156 of the third control multiplexer 124 may be zero. Accordingly, the first and second multiplexers 160 and 162 of the logic circuit 114 will be configured into the active low latch mode. For the active low latch mode, the clock can be selected from the routed clock input 130, the hardwired clock input 158, and the input/output clock input 159 depending on the clock control signal 134 and/or the routed clock input 130. It will be understood that the logic circuit 114 may be otherwise configured into the active low latch mode within the scope of the present invention.

The logic circuit 114 may be configured into the active high latch (low transparent) mode by setting the first control input 140 to zero, the second control input 142 to zero and the third control input 152 to one. As a result, the first control function 146 of the second control multiplexer 122 may be zero and the second control function 156 of the third control multiplexer 124 may be the second intermediate clock function 136. Accordingly, the first and second multiplexers 160 and 162 of the logic circuit 114 will be configured into the active high latch mode. For the active high latch mode, the clock can be selected from the routed clock input 130, the hardwired clock input 158, and the input/output clock input 159 depending on the clock control signal 134 and/or the routed clock input 130. It will be understood that the logic circuit 114 may be otherwise configured into the active high latch mode within the scope of the present invention.

The logic circuit 114 may be configured into the transparent mode by setting the first control input 140 to zero, the second control input 142 to zero and the third control input 152 to zero. As a result, the first control function 146 of the second control multiplexer 122 may be zero and the second control function 156 of the third control multiplexer 124 may also be zero. Accordingly, the first and second multiplexers 160 and 162 of the logic circuit 114 will be configured into the transparent mode. It will be understood that the logic circuit 114 may be otherwise configured into the transparent mode within the scope of the present invention.

In accordance with another aspect of the present invention, the configurable logic circuit 110 may comprise a bypass 190. In one embodiment, the bypass 190 may be included in the control circuit 112. It will be understood that the bypass 190 may be otherwise disposed in the configurable logic circuit 110 within the scope of the present invention. For example, the bypass may be included in the logic circuit 114.

The bypass 190 may comprise a bypass switch 192 connected between an input line 194 and an output line 196 of the logic circuit 114. The bypass switch 192 may close in response to the transparent mode combination of the first and second control functions 146 and 156 to allow the data input 170 received at the input line 194 to be transmitted to the output line 196 as the data function 184. Accordingly, operation of the configurable logic circuit 110 may be speeded up in the transparent mode.

In one embodiment, the bypass switch 192 may comprise a conventional NMOS transistor. In this embodiment, a NOR gate 198 may be coupled to the transistor to close the transistor in response to the transparent mode combination of the first and second control functions 146 and 156. Thus, for the particular embodiment described above, the NOR gate 198 will close the transistor to allow the data input 170 received at the input line 194 to be transmitted to the output line 196 as the data function 184 in response to the first and second control functions 146 and 156 being zero. It will be understood that the bypass 190 may be otherwise configured within the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A configurable logic circuit, comprising:
   a control circuit operable to generate an intermediate clock function in response to selection of one of a first and a second clock input based on a clock control input, generate a first control function in response to selection of one of a first and a second control input based on the intermediate clock function and generate a second control function in response to selection of one of the second and a third control input based on the intermediate clock function; and
   a logic circuit coupled to the control circuit and operable to be configured into one of a plurality of logic modes in response to a combination of the first and second control functions.

2. The configurable logic circuit of claim 1, further comprising the logic circuit operable to be configured into one of a rising edge triggered flip-flop mode and a falling edge triggered flip-flop mode in response to the combination of the first and second control functions.

3. The configurable logic circuit of claim 1, further comprising the logic circuit operable to be configured into one of a rising edge triggered flip-flop mode, a falling edge triggered flip-flop mode, an active high latch mode and an active low latch mode in response to the combination of the first and second control functions.

4. The configurable logic circuit of claim 1, further comprising the logic circuit operable to be configured into one of a rising edge triggered flip-flop mode, a falling edge triggered flip-flop mode, an active high latch mode, an active low latch mode and a transparent mode in response to the combination of the first and second control functions.

5. The configurable logic circuit of claim 1, the logic circuit operable to be configured into a rising edge triggered flip-flop mode in response to a first combination of the first and second control functions, a falling edge triggered flip-flop mode in response to a second combination of the first and second control functions, an active high latch mode in response to a third combination of the first and second control functions, an active low latch mode in response to a fourth combination of the first and second control functions and a transparent mode in response to a fifth combination of the first and second control functions.

6. The configurable logic circuit of claim 1, the first clock input comprising a routed clock signal and the second clock input comprising a hardwired clock signal.

7. The configurable logic circuit of claim 1, the control circuit comprising:
   a first control multiplexer to generate the intermediate clock function in response to selection of one of the first and the second clock input based on the clock control input;
   a second control multiplexer to generate the first control function in response to selection of one of the first and the second control input based on the intermediate clock function; and
   a third control multiplexer to generate the second control function in response to selection of one of the second and the third control input based on the intermediate clock function.

8. The configurable logic circuit of claim 7, the control circuit comprising a fourth control multiplexer to generate the second clock input in response to selection of one of a third and a fourth clock input based on a second clock control input.

9. The configurable logic circuit of claim 1, the control circuit further operable to generate the second clock input in response to selection of one of a third and a fourth clock input based on a second clock control input.

10. The configurable logic circuit of claim 9, the second clock control input further comprising the first clock input.

11. The configurable logic circuit of claim 9, the first clock input comprising a routed clock signal, the third clock input comprising a hardwired clock signal, the fourth clock input comprising an input/output clock signal and the second clock control input comprising the routed clock signal.

12. The configurable logic circuit of claim 1, the logic circuit comprising a first logic multiplexer operable to receive the first control function and a second logic multiplexer coupled to the control circuit to receive the second control function.

13. The configurable logic circuit of claim 1, the logic circuit further comprising:
   a first logic multiplexer operable to generate an intermediate data function in response to selection of one of a data input and a feedback intermediate data function based on the first control function; and
   a second logic multiplexer operable to generate a data function in response to selection of one of the intermediate data function and a feedback data function based on the second control function.

14. The configurable logic circuit of claim 1, further comprising a bypass switch connected between an input line and an output line of the logic circuit, the bypass switch operable to close in response to the combination of the first and second control functions.

15. The configurable logic circuit of claim 14, further comprising a NOR gate coupled to the bypass switch to close the bypass switch in response to the combination of the first and second control functions.

16. A field programmable gate array, comprising:
   a control circuit operable to generate an intermediate clock function in response to selection of one of a first and a second clock input based on a clock control input, generate a first control function in response to selection of one of a first and a second control input based on the intermediate clock function, generate a second control function in response to selection of one of the second and a third control input based on the intermediate clock function; and
   a logic circuit coupled to the control circuit and operable to be configured into one of a plurality of logic modes in response to a combination of the first and second control functions.

17. The field programmable gate array of claim 16, further comprising:
   a first control multiplexer to generate the intermediate clock function in response to selection of one of the first and the second clock input based on the clock control input;
   a second control multiplexer to generate the first control function in response to selection of one of the first and the second control input based on the intermediate clock function;
   a third control multiplexer to generate the second control function in response to selection of one of the second and the third control input based on the intermediate clock function;
   a first logic multiplexer operable to generate an intermediate data function in response to selection of one of a data input and a feedback intermediate data function based on the first control function;
   a second logic multiplexer operable to generate a data function in response to selection of one of the intermediate data function and a feedback data function based on the second control function; and
   the logic circuit operable to be configured into one of a rising edge triggered flip-flop mode, a falling edge triggered flip-flop mode, an active high latch mode, an active low latch mode and a transparent mode in response to the combination of the first and second control functions.

18. The field programmable gate array of claim 17, further comprising a fourth control multiplexer to generate the second clock input in response to selection of one of a third and a fourth clock input based on a second clock control input.

19. A method of configuring a logic circuit, comprising the steps of:
   receiving a first clock input;
   receiving a second clock input;
   receiving a clock control input;
   generating an intermediate clock function in response to selection of one of the first and the second clock input based on the clock control input;
   receiving a first control input;
   receiving a second control input;
   generating a first control function in response to selection of one of the first and the second control input based on the intermediate clock function;
   receiving a third control input;
   generating a second control function in response to selection of one of the second and the third control input based on the intermediate clock function; and
   configuring a logic circuit into one of a plurality of logic modes in response to a combination of the first and second control functions.

20. The method of claim 19, further comprising the steps of:
   receiving a third clock input;
   receiving a fourth clock input;
   receiving a second clock control input; and
   generating the second clock input in response to selection of one of the third and the fourth clock signal based on a second clock control input.

* * * * *

UNITED STATES PATENT AND TRADEMARK OFFICE
CERTIFICATE OF CORRECTION

PATENT NO: 5,977,792
DATED: November 2, 1999
INVENTOR(S): Mahesh M. Mehendale

It is certified that error appears in the above-identified patent and that said Letters Patent is hereby corrected as shown below:

On the title page, item [75]:
Inventor's name should read as follows:

Mahesh M. Mehendale

Signed and Sealed this

Nineteenth Day of September, 2000

*Attest:*

Q. TODD DICKINSON

*Attesting Officer*  *Director of Patents and Trademarks*